(12) United States Patent
Yamazaki et al.

(10) Patent No.: US 8,123,856 B2
(45) Date of Patent: Feb. 28, 2012

(54) METHOD AND APPARATUS FOR PRODUCING GROUP III NITRIDE BASED COMPOUND SEMICONDUCTOR

(75) Inventors: Shiro Yamazaki, Aichi (JP); Makoto Iwai, Nagoya (JP); Takanao Shimodaira, Nagoya (JP); Takatomo Sasaki, Suita (JP); Yusuke Mori, Suita (JP); Fumio Kawamura, Suita (JP)

(73) Assignees: Toyoda Gosei Co., Ltd., Aichi-ken (JP); NGK Insulators, Ltd., Aichi (JP); Osaka University, Osaka (JP)

( * ) Notice: Subject to any disclaimer, the term of this patent is extended or adjusted under 35 U.S.C. 154(b) by 668 days.

(21) Appl. No.: 12/225,550

(22) PCT Filed: Apr. 5, 2007

(86) PCT No.: PCT/JP2007/058023
§ 371 (c)(1),
(2), (4) Date: Nov. 19, 2008

(87) PCT Pub. No.: WO2007/117032
PCT Pub. Date: Oct. 18, 2007

(65) Prior Publication Data
US 2009/0173273 A1   Jul. 9, 2009

(30) Foreign Application Priority Data
Apr. 7, 2006 (JP) .................................. 2006-106860

(51) Int. Cl.
*C30B 19/00* (2006.01)
*C30B 19/06* (2006.01)

(52) U.S. Cl. .............. 117/73; 117/77; 117/78; 117/200; 117/206; 117/900; 117/952; 422/245.1

(58) Field of Classification Search .................... 117/73, 117/77, 78, 200, 206, 900, 952; 422/245.1
See application file for complete search history.

(56) References Cited

U.S. PATENT DOCUMENTS
6,770,135 B2   8/2004   Schowalter et al.
(Continued)

FOREIGN PATENT DOCUMENTS
JP   2001-58900   3/2001
(Continued)

OTHER PUBLICATIONS
German Office Action dated Mar. 30, 2010 with English-language translation.
(Continued)

*Primary Examiner* — Karl Group
(74) *Attorney, Agent, or Firm* — McGinn IP Law Group, PLLC

(57) ABSTRACT

In the flux method, a source nitrogen gas is sufficiently heated before feeding to an Na—Ga mixture.
The apparatus of the invention is provided for producing a group III nitride based compound semiconductor. The apparatus includes a reactor which maintains a group III metal and a metal differing from the group III metal in a molten state, a heating apparatus for heating the reactor, an outer vessel for accommodating the reactor and the heating apparatus, and a feed pipe for feeding a gas containing at least nitrogen from the outside of the outer vessel into the reactor. The feed pipe has a zone for being heated together with the reactor by means of the heating apparatus, wherein the zone is heated inside the outer vessel and outside the reactor.

7 Claims, 2 Drawing Sheets

U.S. PATENT DOCUMENTS

| | | | |
|---|---|---|---|
| 7,220,311 B2 * | 5/2007 | Iwata et al. | 117/73 |
| 7,381,268 B2 * | 6/2008 | Minemoto et al. | 117/216 |
| 2004/0134413 A1 | 7/2004 | Iwata et al. | |

FOREIGN PATENT DOCUMENTS

| | | |
|---|---|---|
| JP | 2004-168650 | 6/2004 |
| JP | 2005-60216 | 3/2005 |
| JP | 2005-247594 | 9/2005 |
| JP | 2006-511432 | 4/2006 |
| JP | 2006-313099 | 11/2006 |
| WO | WO 2005/095681 | 10/2005 |

OTHER PUBLICATIONS

Form PCT/ISA/237.
Form PCT/IB/326, Oct. 2008.
German Office Action dated Feb. 23, 2011, with English translation.

* cited by examiner

METHOD AND APPARATUS FOR PRODUCING GROUP III NITRIDE BASED COMPOUND SEMICONDUCTOR

TECHNICAL FIELD

The present invention relates to a method and apparatus for producing a group III nitride based compound semiconductor. The present invention relates to the so-called flux method including feeding nitrogen to the surface of a melt such as a molten Na—Ga mixture, to thereby grow GaN on the surface of a GaN seed crystal.

BACKGROUND ART

Methods for growing crystals of gallium nitride (GaN) and other group III nitride based compound semiconductors through the flux method are disclosed in, for example, the Patent Documents below. In one of these methods, gallium (Ga) is dissolved in molten sodium (Na) at a constant temperature of about 800° C., and gallium is reacted with nitrogen under high pressure of about 100 atm, to thereby grow gallium nitride (GaN) on the surface of a seed crystal. One known apparatus 9000 for producing a group III nitride based compound semiconductor is shown in FIG. 4. The apparatus has an openable/closable double hermetic vessel structure having a reactor 100 and an outer vessel 200, which are resistant to high temperature and pressure. The reactor 100 is heated by means of heating apparatuses 31a, 31b, and 31c disposed in the outer vessel 200, to thereby melt sodium (Na) and gallium (Ga) contained in the reactor 100. To the reactor 100, a nitrogen feed pipe 10 and a discharge pipe 11 are connected. Feeding and discharging nitrogen is carried out, while the internal pressure of the reactor 100 is controlled to, for example, 100 atm, by means of a controller (not illustrated).

[Patent Document 1] Japanese Patent Application Laid-Open (kokai) No. 2001-058900
[Patent Document 2] Japanese Patent Application Laid-Open (kokai) No. 2003-313099

In the flux method, nitrogen gas for enclosing the reaction system also serves as a source for forming GaN, and is consumed as the progress of reaction. Thus, preferably, additional nitrogen is appropriately fed to the reaction system while the pressure of the system is maintained. However, when the additionally fed nitrogen is not heated to a temperature almost equivalent to the temperature of a molten Na—Ga mixture, GaN crystals other than the seed crystal are deposited at random in the surface of the flux. This phenomenon impairs efficiency of production of a thick single-crystal substrate.

DISCLOSURE OF THE INVENTION

The present invention has been conceived to solve the aforementioned problem. Thus, an object of the present invention is to effectively grow a crystal on a seed crystal in the flux method by feeding, to a reaction system, source nitrogen gas which has been sufficiently heated.

Accordingly, in a first aspect of the present invention, there is provided a method for producing a group III nitride based compound semiconductor, the method comprising feeding a nitrogen-containing gas to a flux containing a group III metal and a metal differing from the group III metal maintained in a molten state, characterized in that the nitrogen-containing gas fed to the flux is heated to a temperature almost equivalent to the temperature of the molten substance before the gas is brought into contact with the molten substance. As used herein, the term "nitrogen-containing gas" refers to a single-component gas or a gas mixture containing nitrogen molecules and/or a gaseous nitrogen compound. For example, the nitrogen-containing gas may contain an inert gas such as a rare gas in a desired proportion.

In a second aspect of the present invention, there is provided an apparatus for producing a group III nitride based compound semiconductor, the apparatus comprising a reactor which maintains a group III metal and a metal differing from the group III metal in a molten state, a heating apparatus for heating the reactor, an outer vessel for accommodating the reactor and the heating apparatus, and a feed pipe for feeding a gas containing at least nitrogen from the outside of the outer vessel into the reactor, characterized in that the feed pine has a zone or being heated together with the reactor bad means of the heating apparatus, wherein the zone is heated inside the outer vessel and outside the reactor.

In a third aspect of the present invention, there is provided an apparatus for producing a group III nitride based compound semiconductor, the apparatus comprising a reactor which maintains a group III metal and a metal differing from the group III metal in a molten state, a first heating apparatus for heating the reactor, an outer vessel for accommodating the reactor and the first heating apparatus, and a feed pipe for feeding a gas containing at least nitrogen from the outside of the outer vessel into the reactor, characterized in that the feed pipe has a zone for being heated together with the reactor by means of the second heating apparatus, wherein the zone is heated inside the outer vessel and outside the reactor.

In a fourth aspect of the present invention, there is provided an apparatus for producing a group III nitride based compound semiconductor, the apparatus comprising a reactor which maintains a group III metal and a metal differing from the group III metal in a molten state, a heating apparatus for heating the reactor, an outer vessel for accommodating the reactor and the heating apparatus, and a feed pipe for feeding a gas containing at least nitrogen from the outside of the outer vessel into the reactor, characterized in that the reactor has, on the outer periphery thereof, a temperature elevating member, connected to the feed pipe, for heating the gas containing at least nitrogen during passage therethrough before the gas is fed to the group III metal and the metal differing from the group III metal which are in a molten state.

According to the present invention, a source nitrogen gas employed in the flux method can be sufficiently heated before feeding to the reaction system. Specifically, according to the second aspect of the invention, the heating apparatus provided for heating the reactor is preferably adapted to heat the feed pipe for feeding a nitrogen-containing gas before feeding to the reactor. Alternatively, according to the third aspect of the invention, there is preferably provided a second heating apparatus for heating the feed pipe for feeding a nitrogen-containing gas before feeding to the reactor. Still alternatively, according to the fourth aspect of the invention, preferably, the nitrogen-containing gas is heated by means of a temperature elevating member provided at the outer periphery of the reactor, and then fed to the molten metal contained in the reactor. In any case, according to the present invention, the nitrogen-containing gas—serving as a source gas—can be sufficiently heated in a simple manner. Therefore, crystal growth occurs at high efficiency on a seed crystal without growing useless crystals.

BEST MODES FOR CARRYING OUT THE INVENTION

The present invention can be applied to a method and apparatus for producing a group III nitride based compound semiconductor, the method and apparatus employing a reactor for carrying out the flux method, a heating apparatus, and an outer vessel for accommodating the reactor and the heating apparatus. The feed pipe for feeding a nitrogen-containing gas may have any desired shape. For example, in the configuration in which the feed pipe is heated together with the reactor by means of a heating apparatus, the feed pipe is preferably disposed in the space between the reactor and the heating apparatus. In another preferred mode, the feed pipe is disposed in a spiral manner in the space, and has such a large length and capacity as to be heated sufficiently. In the case where a second heating apparatus, which is separately disposed from the first heating apparatus for heating the reactor, is employed for heating the feed pipe, the positions of the second heating apparatus and the feed pipe are not limited to the space between the reactor and the first heating apparatus, and may be placed in any desired positions in the outer vessel.

Embodiment 1

Figure 1:
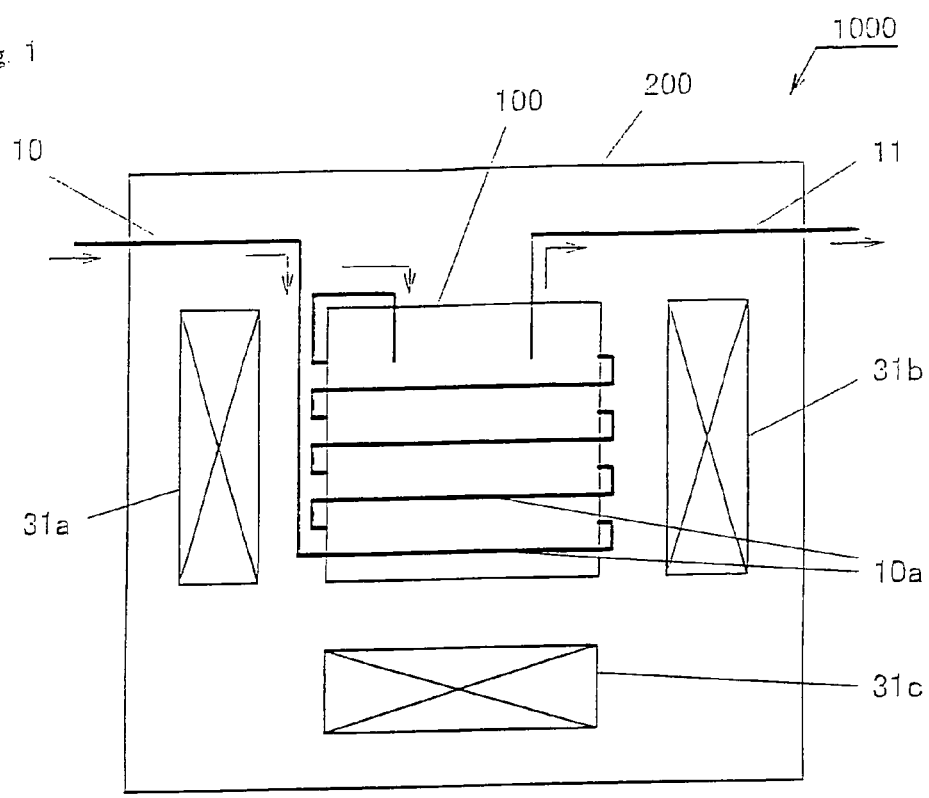
FIG. 1 is a schematic view of the configuration of an apparatus 1000 for producing a group III nitride based compound semiconductor of Embodiment 1 of the present invention.

FIG. 1 is a schematic view of the configuration of an apparatus 1000 for producing a group III nitride based compound semiconductor of Embodiment 1 of the present invention. As shown in FIG. 1, the production apparatus 1000 has an openable/closable hermetic double vessel including a reactor 100 and an outer vessel 200, which are resistant to high temperature and pressure. The reactor 100 has a capacity of about 0.1 to 100 L, and the outer vessel 200 has a capacity of about 1 to 100 m$^3$. In the outer vessel 20D heating apparatuses 31a, 31b, and 31c are disposed. The heating apparatuses 31a and 31b are disposed near the sidewall of the reactor 100, and the heating apparatus 31c is disposed under the bottom surface of the reactor 100. By means of these heating apparatuses 31a, 31b, and 31c, the reactor 100 is heated to, for example, 800 to 900° C. Through heating, a melt (flux) containing sodium (Na) and gallium (Ga) is formed. To the reactor 100, a nitrogen feed pipe 10 and a discharge pipe 11 are connected. Feeding and discharging of nitrogen is carried out, while the internal pressure of the reactor 100 is controlled to, for example, 100 atm, by means of a controller (not illustrated). The nitrogen feed pipe 10 has a heating section 10a, which is formed by spirally winding the nitrogen feed pipe 10 around the reactor 100. That is, nitrogen fed through the feed pipe 10 runs through the spiral heating section 10a provided around the reactor 100 over a sufficiently long period of time. When nitrogen passes through the heating section 10a, the section 10a is heated by means of heating apparatuses 31a, 31b, and 31c to a temperature as high as that of the reactor 100 (about 800 to 900° C.). The heating section 10a may or may not be in direct contact with the outer periphery of the reactor 100. Thus, sufficiently heated nitrogen can be supplied to the surface of the flux contained in the reactor 100, and as a result, a high-quality crystal can be selectively grown on a seed crystal without forming useless crystals on the surface of the flux.

Embodiment 2

Figure 2:
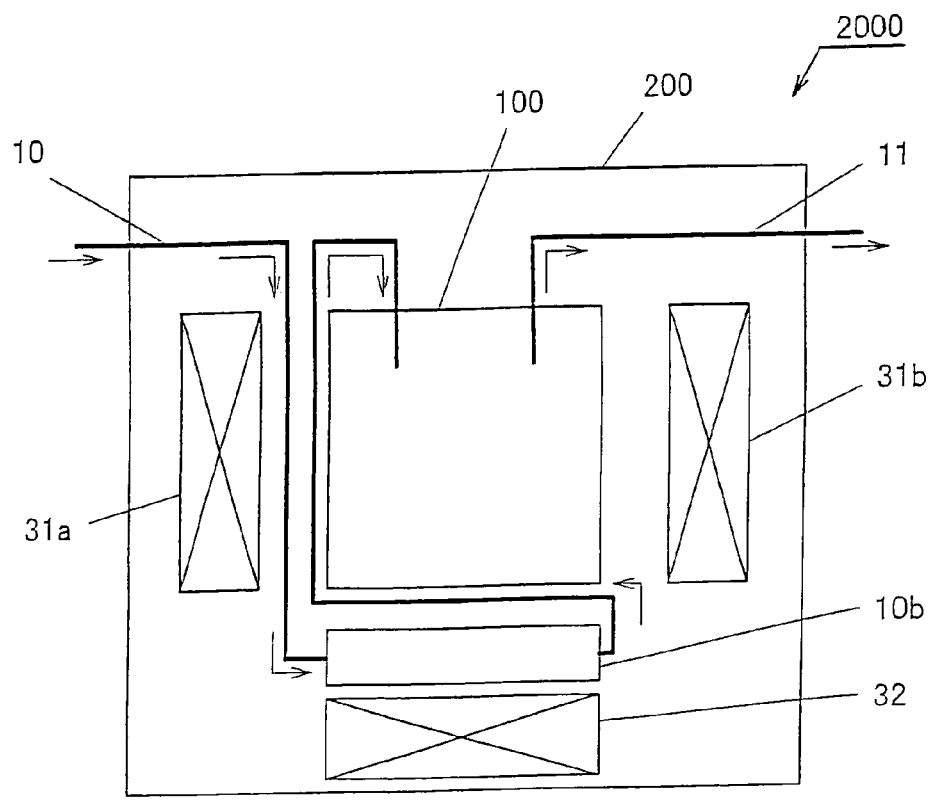
FIG. 2 is a schematic view of the configuration of an apparatus 2000 for producing a group III nitride based compound semiconductor of Embodiment 2 of the present invention.

FIG. 2 is a schematic view of the configuration of an apparatus 2000 for producing a group III nitride based compound semiconductor of Embodiment 2 of the present invention. As shown in FIG. 2, the production apparatus 2000 has an openable/closable hermetic double vessel including a reactor 100 and an outer vessel 200, which are resistant to high temperature and pressure. In the outer vessel 200, first heating apparatuses 31a and 31b, and a heating section 10b and a second heating apparatus 32 are disposed. The heating apparatuses 31a and 31b are disposed near the sidewall of the reactor 100. The heating section 10b is formed from a part of a nitrogen feed pipe 10, and is disposed under the bottom surface of the reactor 100. The second heating apparatus 32 for heating the heating section is disposed under the heating section 10b. The reactor 100 is heated by means of the heating apparatuses 31a and 31b. To the reactor 100, the nitrogen feed pipe 10 is connected by the mediation of the heating section 10b, and a discharge pipe 11 is connected to the reactor 100. Feeding and discharging of nitrogen is carried out, while the internal pressure of the reactor 100 is controlled to, for example, 100 atm, by means of a controller (not illustrated). The nitrogen feed pipe 10 has the heating section 10b in which the gas is heated before being fed to the reactor 100. The heating section 10b is heated by means of the second heating apparatus 32. The heating section 10b is formed of a material of high thermal conductivity such as copper so that the heat radiated by the heating apparatus 32 is effectively supplied to nitrogen. For example, the heating section 10b includes a copper-based support, which is connected to the nitrogen feed pipe 10, and through which the nitrogen piping 10 penetrates. The nitrogen piping 10 may penetrate the support a single time, or penetrate such that the piping bends several times to and from the full length of the support. In the heating section 10b, nitrogen receives heat energy from the atmosphere. Through employment of this configuration, nitrogen fed through the nitrogen feed pipe 10 is heated in the heating section 10b by means of the healing apparatus 32 to a temperature almost equivalent to the temperature of the reactor 100 (about 800 to 900° C.), before the gas reaches the reactor 100. Thus, sufficiently heated nitrogen can be supplied to the surface of the flux contained in the reactor 100, and as a result, a high-quality crystal can be selectively grown on a seed crystal without forming useless crystals on the surface of the flux.

Embodiment 3

Figure 3:
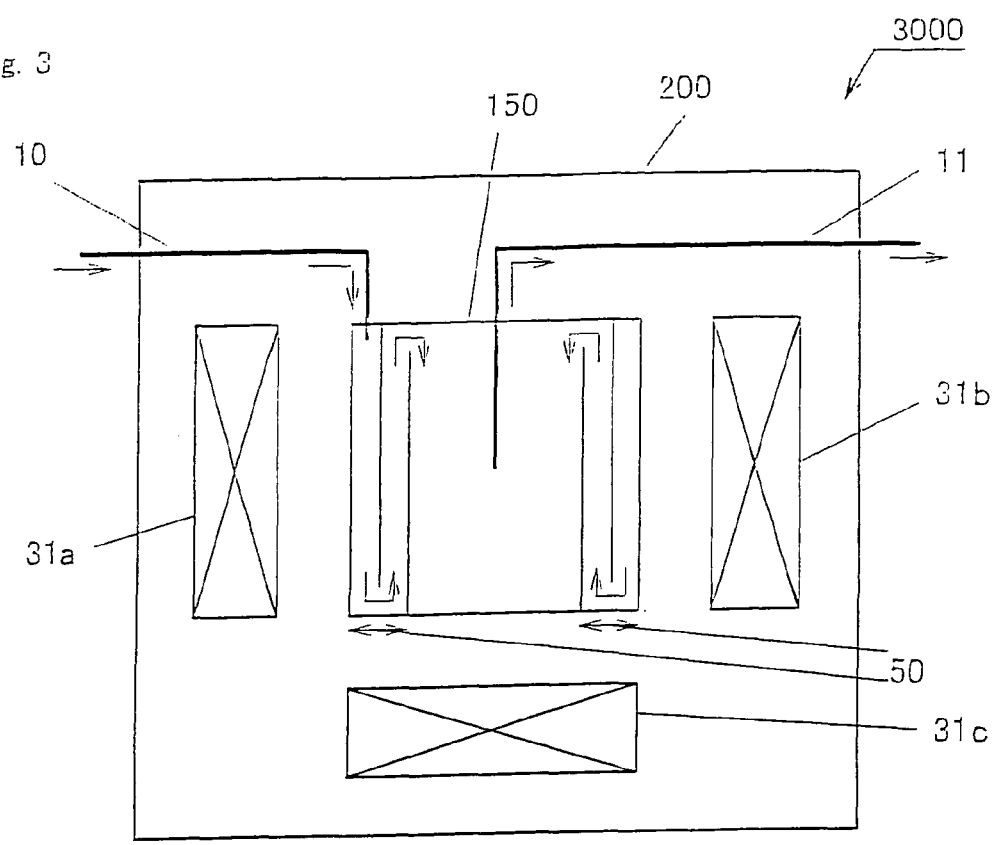
FIG. 3 is a schematic view of the configuration of an apparatus 3000 for producing a group III nitride based compound semiconductor of Embodiment 3 of the present invention.
Figure 4:
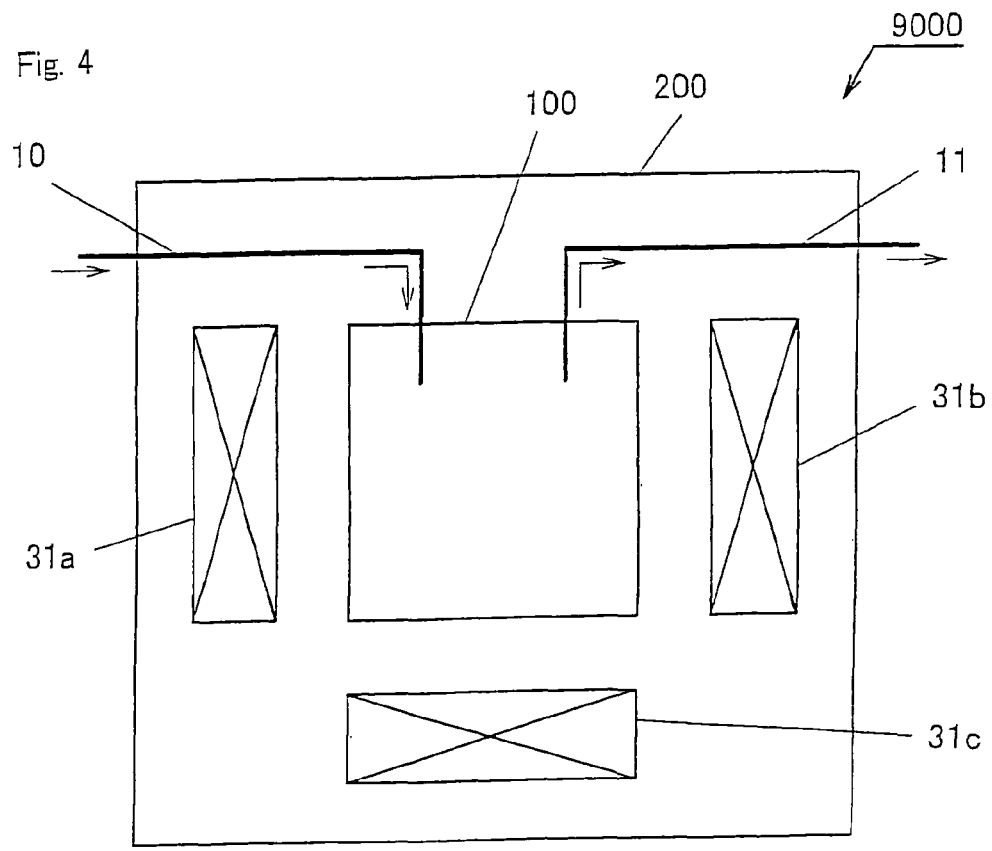
FIG. 4 is a schematic view of the configuration of a conventional apparatus 9000 for producing a group III nitride based compound semiconductor.

FIG. 3 is a schematic view of the configuration of an apparatus 3000 for producing a group III nitride based compound semiconductor of Embodiment 3 of the present invention. As shown in FIG. 3, the production apparatus 3000 has an openable/closable hermetic double-vessel including a reactor 150 and an outer vessel 200, which are resistant to high temperature and pressure. In the outer vessel 200, the reactor 150 for crystal growth and heating apparatuses 31a, 31b, and 31c for heating the reactor 150 are disposed. The heating apparatuses 31a and 31b are disposed near the sidewall of the reactor 100, while the heating apparatus 31c is disposed under the bottom surface of the reactor 100. On the outer sidewall of the reactor 150, a temperature elevating member 50 is disposed, the temperature elevating member being connected to a reaction area 152 but being a member differing from the reaction area 152. As shown in FIG. 3, the temperature elevating member 50 has a path-extending structure such that the path is extended to have length a length the height of the reactor 150. In Embodiment 3, the path is turned once. However, needless to say, the path may be turned twice or more so as to prolong the nitrogen path length. A nitrogen feed pipe 10 is connected to the temperature elevating member 50 provided on the outer periphery of the reactor 150. Nitrogen is fed via the temperature elevating member 50 to the reaction area 152 in the reactor 150. A discharge pipe 11 is connected to the reactor 150. Feeding and discharging of nitrogen is carried out, while the internal pressure of the reactor 150 is controlled to, for example, 100 atm, by means of a controller (not illustrated). Nitrogen fed through the nitrogen feed pipe 10 is heated to a temperature almost equivalent to the inside temperature of the reactor 150 in the temperature elevating member 50, before nitrogen reaches the reactor 150. That is, nitrogen fed through the nitrogen feed pipe 10 is heated in the temperature elevating member 50 by means of the heating apparatuses 31$a$, 31$b$, and 31$c$ to a temperature almost equivalent to the temperature of the reactor 150 (about 800 to 900° C.), before the gas reaches the reactor 150. Thus, sufficiently heated nitrogen can be supplied to the surface of the flux contained in the reactor 150, and as a result, a high-quality crystal can be selectively grown on a seed crystal without forming useless crystals on the surface of the flux.

In Embodiment 3, the temperature elevating member 50 is provided entirely on the outer sidewall of the reactor 150 with a path length twice the wall height (upward and downward). However, instead of such a configuration, a pipe which runs upward and downward to partially cover the outer sidewall of the reactor 150 may be provided on the outer sidewall.

The invention claimed is:

1. An apparatus for producing a group III nitride based compound semiconductor, the apparatus comprising:
   a reactor which maintains a group III metal and a metal differing from the group III metal in a molten state;
   a heating apparatus for heating the reactor;
   an outer vessel for accommodating the reactor and the heating apparatus; and
   a feed pipe for feeding a gas containing at least nitrogen from an outside of the outer vessel into the reactor,
   wherein the feed pipe comprises a heating section which is wound around an outer periphery of the reactor and is heated together with the reactor by the heating apparatus, and is heated inside the outer vessel and outside the reactor.

2. An apparatus for producing a group III nitride based compound semiconductor, the apparatus comprising:
   a reactor which maintains a group III metal and a metal differing from the group III metal in a molten state;
   a first heating apparatus for heating the reactor
   an outer vessel for accommodating the reactor and the first heating apparatus; and
   a feed pipe for feeding a gas containing at least nitrogen from an outside of the outer vessel into the reactor,
   wherein the feed pipe comprises a zone for being heated together with the reactor by a second heating apparatus, wherein the zone is heated inside the outer vessel and outside the reactor.

3. An provided an apparatus for producing a group III nitride based compound semiconductor, the apparatus comprising:
   a reactor which maintains a group III metal and a metal differing from the group III metal in a molten state;
   a heating apparatus for heating the reactor;
   an outer vessel for accommodating the reactor and the heating apparatus; and
   a feed pipe for feeding a gas containing at least nitrogen from an outside of the outer vessel into the reactor,
   wherein the reactor comprises, on an outer periphery thereof, a temperature elevating member, connected to the feed pipe, for heating the gas containing at least nitrogen during passage therethrough before the gas is fed to the group III metal and the metal differing from the group III metal, which are in a molten state.

4. The apparatus of claim 1, wherein the gas containing at least nitrogen is heated by the heating section of the feed pipe and is fed to the reactor.

5. The apparatus of claim 1, wherein the feed pipe is disposed in a space between the reactor and the heating apparatus.

6. The apparatus of claim 1, wherein the heating apparatus comprises a plurality of heaters disposed near sidewalls and under a bottom surface of the reactor.

7. The apparatus of claim 1, wherein the heating section abuts the outer periphery of the reactor.

* * * * *